United States Patent [19]

Nowaczyk

[11] Patent Number: 4,574,224
[45] Date of Patent: Mar. 4, 1986

[54] VARIABLE RATE HORIZONTAL DEFLECTION SYSTEM FOR A VIDEO MONITOR

[75] Inventor: Philip J. Nowaczyk, Chicago, Ill.

[73] Assignee: Zenith Electronics Corporation, Glenview, Ill.

[21] Appl. No.: 524,165

[22] Filed: Aug. 17, 1983

[51] Int. Cl.$^4$ .................. H01J 29/70; H01J 29/76
[52] U.S. Cl. ........................... 315/408; 358/243
[58] Field of Search ............ 315/408, 411; 358/190, 358/243

[56] References Cited

U.S. PATENT DOCUMENTS 4,074,323 2/1978 Griffey ........................ 315/411
4,286,292 8/1981 Marino ........................ 358/190
4,414,494 11/1983 Schmidt ........................ 315/395

Primary Examiner—Theodore M. Blum

[57] ABSTRACT

A CRT video display includes a horizontal oscillator for producing a variable rate horizontal scan control signal in response to different resolution modes of operation. A horizontal output signal is produced in response to the variable rate horizontal scan control signal and a B+ voltage. The pulse amplitude of the horizontal output signal is maintained constant in response to changes in the rate of the horizontal scan control signal by appropriately adjusting the B+ voltage, whereby the high voltage and horizontal raster size of the display are maintained constant despite variations in the horizontal scan control signal which accommodate different resolution modes of operation.

22 Claims, 1 Drawing Figure

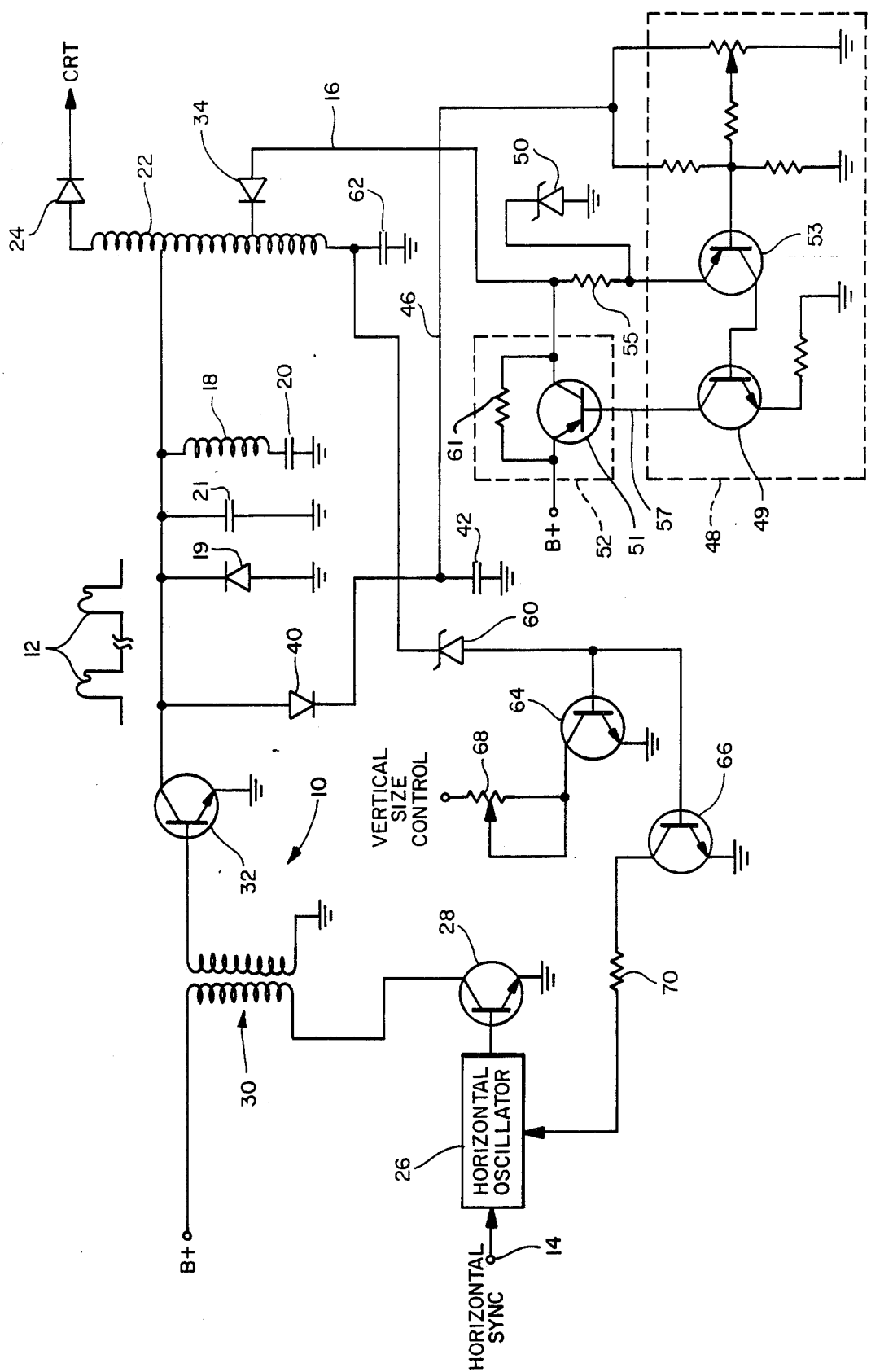

VARIABLE RATE HORIZONTAL DEFLECTION SYSTEM FOR A VIDEO MONITOR

BACKGROUND OF THE INVENTION

The present invention relates generally to horizontal scan circuits for cathode ray tube (CRT) displays and particularly concerns a horizontal scan circuit capable of operation over a range of horizontal scan frequencies.

Computer driven video monitors are frequently operated in multiple resolution modes each often requiring a different horizontal scan frequency. In particular, the horizontal scan frequency at which the video monitor is operated is normally increased as the desired resolution is increased. For example, for a resolution of 700 lines a typical video monitor may be operated at a horizontal scan frequency of 15 KHz, with the horizontal scan frequency being increased to 32 KHz for a resolution of 1400 lines.

Horizontal scan oscillators capable of operation over a range of frequencies are well known in the art. Such oscillators normally drive a horizontal output stage for developing a horizontal output pulse signal which is applied to a horizontal yoke for horizontally deflecting an electron beam of the CRT and to a sweep transformer for developing the necessary high voltage for the CRT. It is well known that, in such systems, the amplitude of the horizontal output pulses is inversely related to the frequency of the horizontal scan oscillator. Thus, the amplitude of the horizontal output pulses will decrease as the horizontal oscillator frequency increases and visa versa. Such a decrease in horizontal output pulse amplitude with increasing horizontal scan frequency will result in a decreased horizontal deflection signal thereby reducing the horizontal size of the CRT display as well as a decreased high voltage signal.

In order to overcome these problems of reduced horizontal raster size and reduced high voltage when operating the horizontal deflection system of a video monitor over a range of scan frequencies, it has been proposed to switch between two essentially separate horizontal systems each tailored to provide proper operation of the monitor at a specific horizontal scan frequency. Switched dual horizontal deflection systems of this type require the use of a relatively complex and costly switching mechanism to switch between the two horizontal systems. In addition, since the switching mechanism, typically a multicontact relay, must switch a number of high voltage and current signals, transients are frequently generated which interfere with proper operation of the video monitor.

It is therefore a basic object of the present invention to provide an improved video display capable of operation over a range of horizontal scan frequencies.

It is a further object of the invention to provide a single, non-switched horizontal system for operating a video display over a range of horizontal scan frequencies while automatically maintaining substantially constant horizontal raster size and high voltage.

It is yet a further object of the invention to provide a video display capable of automatically changing an operating characteristic in response to operation at a predetermined horizontal scan frequency.

BRIEF DESCRIPTION OF THE DRAWINGS

The features of this invention which are believed to be novel are set forth with particularity in the appended claims. The invention, together with its objects and the advantages thereof, may best be understood by reference to the following description taken in conjunction with the accompanying drawings in which the sole FIGURE is an electrical schematic diagram showing a presently preferred embodiment of the invention.

DESCRIPTION OF THE PREFERRED EMBODIMENT

Referring to the FIGURE, a horizontal deflection system for a CRT-based video display comprises a horizontal output circuit 10 which produces a horizontal output signal represented by pulses 12 in response to a horizontal sync signal provided at an input terminal 14 and a B+ voltage established on a conductor 16. The horizontal output signal is developed across a damper diode 19, a damper capacitor 21 and a horizontal yoke 18, yoke 18 being coupled to ground by an AC coupling capacitor 20, for horizontally deflecting an electron beam of the video display CRT in a manner well known in the art. The horizontal output signal is additionally applied to a high voltage sweep transformer 22 which, in conjunction with a high voltage diode 24, converts the horizontal output signal to a high voltage DC signal for operating the CRT in a manner also well known in the art.

Horizontal output circuit 10 includes a horizontal oscillator 26 which produces an output horizontal scan control signal whose frequency corresponds to the frequency of the horizontal sync signal applied to input terminal 14. In accordance with the invention, the frequency of the horizontal sync signal may vary over a predetermined range of values corresponding to different resolution modes at which the display is operated. Horizontal oscillator 26 may take the form of any of a number of well known circuits for producing the output horizontal scan control signal such that its frequency accurately tracks or follows the frequency of the horizontal sync signal. The variable rate horizontal scan control signal produced by horizontal oscillator 26 is coupled through a horizontal drive transistor 28 and a horizontal drive transformer 30 to the base of a horizontal output transistor 32. The collector of horizontal output transistor 32, which is coupled to the B+ voltage developed on conductor 16 by sweep transformer 22 and a boost diode 34, develops, in conjunction with damper diode 19 and damper capacitor 21, the pulses 12 comprising the horizontal output signal.

It will be appreciated that the frequency of the horizontal output signal, i.e. the repetition rate of pulses 12, will track the frequency of the horizontal scan control signal produced by oscillator 26 and thereby the frequency of the horizontal sync signal applied to input terminal 14. The amplitude of the horizontal output pulses 12, however, will vary as a function of both the frequency of the horizontal scan control signal produced by oscillator 26 and the level of the B+ voltage on conductor 16. In addition, the inductance of yoke 18 and the capacitance of damper capacitor 21 will also have an effect on the amplitude of pulses 12. In particular, the amplitude of the horizontal output pulses 12 will be proportional to the expression $(1/\sqrt{LC}\ f)\ B+$, where L represents the inductance of yoke 18, C the capacitance of damper capacitor 21, f the frequency of the horizontal scan control signal, and B+ the DC voltage level on conductor 16. Assuming that the values of L and C remain constant, it will be observed from this expression that the amplitude of the horizontal output pulses 12 will decrease as the horizontal scan control signal frequency increases for a given value of B+ voltage on conductor 16. This decrease in horizontal pulse amplitude will be reflected in a reduced horizontal raster size and a reduced high voltage signal. Thus, if without taking any further steps, the frequency of the horizontal scan control signal produced by oscillator 26 is increased, i.e. in response to an increased frequency horizontal sync signal, to accommodate an increased resolution mode of operation, the horizontal raster size as well as the level of the high voltage signal will proportionately decrease thereby seriously degrading the operation of the display.

The foregoing problem is overcome according to one aspect of the invention by recognition of the fact that decreases in horizontal output pulse amplitude occasioned by increases in horizontal scan control signal frequency can be conveniently compensated for by appropriately adjusting the level of the B+ voltage developed on conductor 16. In particular, referring to the previously noted expression, it will be seen that the horizontal output pulse amplitude can be maintained at a constant level despite an increase in horizontal scan control signal freuqency by appropriately increasing the B+ voltage level on conductor 16. By means of this technique, multiple resolution modes can be advantageously accommodated using a single, non-switched variable rate horizontal oscillator for producing constant amplitude horizontal output pulses.

Referring back to the FIGURE, the foregoing is accomplished according to a presently preferred embodiment of the invention by coupling the horizontal output pulses 12 developed at the collector of transistor 32 to a series connected diode 40 and capacitor 42. A DC signal having a level proportional to the amplitude of the horizontal output pulses 12 is therefore developed at the common junction of diode 40 and capacitor 42. and applied therefrom via a conductor 46 to one input of a comparator 48 which comprises a diffrerentially connected transistor 53 including associated components and an amplifying transistor 49. A second input of comparator 48 is supplied with a fixed DC reference signal developed across a zener diode 50 coupled to conductor 16 by a resistor 55. The output 57 of comparator 48 comprises an error signal representing the difference between the DC levels of the signals applied to its two inputs and is coupled for controlling a series regulator 52 disposed between a point of fixed B+ voltage and conductor 16. Series regulator 52 comprises a transistor 51 whose base is connected to the output 57 of comparator 48 and whose collector-emitter circuit is connected in series between the point of fixed B+ and conductor 16. A resistor 61 is connected in parallel across the collector-emitter circuit of transistor 51. It will thus be appreciated that the error signal developed on output 57 of comparator 48 controls the conduction of transistor 51 and thereby the impedance of series regulator 52 for producing a corresponding adjusted B+ voltage on conductor 16.

In operation, assume initially that the display is being operated in a low resolution mode wherein a selected horizontal scan control signal frequency in conjunction with a given B+ voltage level on conductor 16 result in horizontal output pulses 12 being characterized by a certain nominal level. This operational mode is maintained by operating series regulator 52 in response to the error signal produced on output 57 of comparator 48 (reflecting the difference between the DC level on conductor 46 and the fixed DC reference level across zener diode 50) for maintaining the desired B+ voltage on conductor 16. When the horizontal scan control signal frequency is increased to accommodate an increased resolution mode, the amplitude of horizontal output pulses 12 will tend to decrease as previously discussed. This pulse amplitude decrease will result in a decreased DC signal level on conductor 46 which, when compared by comparator 48 to the fixed DC reference level across zener diode 50, will cause the error signal developed on output 57 of the comparator to decrease. The conduction of transistor 51 of series regulator 52 will thereby increase, increasing or adjusting the B+ voltage developed on conductor 16 so as to boost the amplitude of the horizontal output pulses for maintaining their nominal level. Similarly, when switching back to a low resolution mode of operation, the accompanying decrease in horizontal scan control signal frequency will tend to increase the amplitude of the horizontal output pulses 12 and thereby the DC voltage on conductor 46. Comparator 48 will sense this increased signal level by comparing it with the fixed reference voltage developed across zener diode 50 and develop an error signal on output 57 for causing series regulator 52 to decrease the adjusted B+ voltage on conductor 16 for maintaining the nominal level of the horizontal output pulses 12. Thus, the B+ voltage developed on conductor 16 is automatically adjusted by series regulator 52 in response to variations in the horizontal scan control signal frequency to maintain the amplitude of the horizontal output pulses at a constant nominal level selected for producing a desired horizontal raster size as well as a desired high voltage signal.

According to another aspect of the invention, various circuits of the display may be automatically activated whenever the horizontal scan control frequency rises above a given level. For example, it may be desired to alter the vertical size of the display or to adjust the phase of the horizontal scan control signal whenever the frequency thereof increases beyond a certain point reflecting a change in the operation of the display from a low resolution mode to a high resolution mode. This aspect of the invention is conveniently implemented by recognizing that the adjusted B+ voltage developed on conductor 16 varies in a direct linear relationship with the horizontal scan control signal frequency. Thus, by sensing the level of the adjusted B+ voltage on conductor 16, various display circuits can be automatically activated at a desired horizontal scan frequency.

Referring to the FIGURE, a zener diode 60 is coupled to the junction between sweep transformer 22 and a B+ capacitor 62. Capacitor 62 is coupled through sweep transformer 22 and boost diode 34 to conductor 16. As a consequence, capacitor 62 develops a voltage which is somewhat greater than but which linearly tracks the adjusted B+ voltage developed on conductor 16. As previously explained, the adjusted B+ voltage on conductors 16 increases with increased horizontal scan control frequency to maintain the amplitude of horizontal output pulses 12 constant. Thus, when switching from a low to a high resolution mode of operation, the increased voltage developed across capacitor 62 is sensed by zener diode 60 which is rendered conductive in response to a predetermined threshold level thereof corresponding to a selected increased horizontal scan control signal frequency. In the illustrated embodiment, conductive zener diode 60 switches on or activates a pair of common emitter transistors 64 and 66. The collector of transistor 64 is coupled through a vertical size control potentiometer 68 to the vertical size control input of the display to vary the vertical size of the raster while the collector of transistor 66 is coupled by a resistor 70 to the phase control input of horizontal oscillator 26 for changing the phase of the horizontal scan control signal. When the horizontal scan control signal frequency is decreased thereby reducing the adjusted B+ voltage on conductor 16 and the voltage developed across capacitor 62, zener diode 60 will be rendered non-conductive de-activating or turning off transistors 64 and 66 and thus re-establishing the low resolution character of the vertical size control signal and the phase of the horizontal scan control signal.

While a particular embodiment of the invention has been shown and described, it will be obvious to those skilled in the art that changes and modifications may be made without departing from the invention in its broader aspects. The aim in the appended claims, therefore, is to cover all such changes and modifications as fall within the true spirit and scope of the invention.

I claim:

1. Apparatus for operating the CRT of a video display, comprising:
   a horizontal deflection yoke;
   means for generating a B+ boltage;
   means for developing a variable frequency horizontal oscillator signal;
   a horizontal output transistor coupled to the horizontal deflection yoke and responsive to said horizontal oscillator signal and to said B+ voltage for developing a horizontal output signal having a frequency corresponding to the frequency of said horizontal oscillator signal and a pulse amplitude which is a function of said B+ voltage and the frequency of said horizontal oscillator signal;
   means coupled between the horizontal output transistor and the horizontal deflection yoke for peak detecting the pulse amplitude of said horizontal output signal; and
   means responsive to said peak detected pulse amplitude for adjusting the level of said B+ voltage to maintain the pulse amplitude of said horizontal output signal constant despite variations in the frequency of the horizontal oscillator signal.

2. Apparatus according to claim 1 wherein said horizontal deflection yoke is coupled to ground by a coupling capacitor and including a high voltage output transformer responsive to said horizontal output signal for developing a high voltage signal for operating said CRT, said adjusted B+ voltage being coupled through said output transformer to said horizontal output transistor.

3. Apparatus according to claim 1 including means responsive to said constant pulse amplitude horizontal output signal for developing a constant high voltage signal for operating said CRT.

4. Apparatus according to claim 3 including circuit means activatable for controlling said display in a selected manner and switching means responsive to a predetermined threshold level of said adjusted B+ voltage for activating said circuit means.

5. Apparatus according to claim 4 wherein said circuit means comprises means activatable for controlling the vertical size of the image produced by said CRT.

6. Apparatus according to claim 4 wherein said circuit means comprises means activatable for controlling the phase of said horizontal oscillator signal.

7. Apparatus according to claim 4 wherein said switching means comprises a zener diode coupled to said adjusted B+ voltage and which is rendered conductive in response to said predetermined threshold level thereof for activating said circuit means.

8. Apparatus according to claim 3 wherein said means for adjusting comprises means for generating an error signal reflecting the difference between said peak detected pulse amplitude of said horizontal ouptut signal and a reference level and regulator means for adjusting the level of said B+ voltage in response to said error signal so as to maintain the pulse amplitude of said horizontal output signal constant despite changes in frequency of the horizontal oscillator signal.

9. Apparatus according to claim 8 wherein said error signal generating means comprises means responsive to said adjusted B+ voltage for developing a fixed reference voltage and means for comparing said peak detected pulse amplitude to said reference voltage for generating said error signal in response to the difference therebetween.

10. Apparatus according to claim 8 wherein said regulator means comprises means connected in series with said B+ voltage generating means and whose impedance is controlled in response to said error signal for generating said adjusted B+ voltage.

11. Apparatus according to claim 9 wherein said means for peak detecting comprises a series connected diode and capacitor coupling said horizontal output signal to ground, said peak detected pulse amplitude being developed at the common junction of said diode and capacitor.

12. Apparatus for operating the CRT of a video display comprising:
   means for generating a B+ voltage;
   regulator means responsive to said B+ voltage and to an error signal for developing an adjusted B+ voltage;
   means for generating a variable frequency horizontal oscillator signal;
   horizontal output transistor means responsive to said horizontal oscillator signal and to said adjusted B+ voltage for developing a horizontal output signal having a frequency corresponding to the frequency of said horizontal oscillator signal and a pulse amplitude which is a function of said adjusted B+ voltage and the frequency of said horizontal oscillator signal;
   yoke means coupled to said horizontal output transistor means and responsive to said horizontal output signal for horizontal deflecting an electron beam of said CRT;
   high voltage transformer means coupled to said horizontal output transistor means and responsive to said horizontal output signal for developing a high voltage signal for operating said CRT, said adjusted B+ voltage being coupled to said horizontal output transistor mean via said high voltage transformer means;
   means coupled between the horizontal output transistor means and the yoke means for peak detecting the pulse amplitude of said horizontal output signal; and
   means responsive to said peak detected pulse amplitude for generating said error signal so as to provide an adjusted B+ voltage adapted to maintain the pulse amplitude of said horizontal output signal constant despite variations in the frequency of said horizontal oscillator signal.

13. Apparatus for operating the CRT of a video display comprising:
   means for generating a B+ voltage;
   regulator means responsive to said B+ voltage and to an error signal for developing an adjusted B+ voltage;
   means for generating a variable frequency horizontal oscillator signal;
   horizontal output transistor means responsive to said horizontal oscillator signal and to said adjusted B+ voltage for developing a horizontal output signal having a frequency corresponding to the frequency of said horizontal oscillator signal and a pulse amplitude which is a function of said adjusted B+ voltage and the frequency of said horizontal oscillator signal;
   yoke means coupled to said horizontal output transistor means and responsive to said horizontal output signal for horizontal deflecting an electron beam of said CRT;
   high voltage transformer means coupled to said horizontal output transistor means and responsive to said horizontal output signal for developing a high voltage signal for operating said CRT, said adjusted B+ voltage being coupled to said horizontal output transistor mean via said high voltage transformer means;
   means coupled between the horizontal output transistor means and the yoke means for peak detecting the pulse amplitude of said horizontal output signal; and
   means for generating a reference signal and means for comparing the reference signal with the peak detected pulse amplitude of the horizontal output signal for developing said error signal based on the difference therebetween so as to provide an adjusted B+ voltage adapted to maintain the pulse amplitude of the horizontal output signal constant despite variations in the frequency of said horizontal oscillator signal.

14. Apparatus according to claim 13 wherein said reference signal generating means comprises means responsive to said adjusted B+ voltage for generating a fixed DC reference voltage and wherein said means for comparing comprises means for comparing said peak detected pulse amplitude to said DC reference voltage for generating said error signal in response to the difference therebetween.

15. Apparatus according to claim 14 wherein said regulator means comprises means connected in series with said B+ voltage generating means and whose impedance is controlled in response to said error signal for generating said adjusted B+ voltage.

16. Apparatus according to claim 14 wherein said means for peak detecting comprises a series connectd diode and capacitor coupled to said horizontal output transistor means, said peak detected pulse amplitude being developed at the common junction of said diode and capacitor.

17. Apparatus according to claim 13 including circuit means activatable for controlling said display in a selected manner and switching means responsive to a predetermined threshold level of said adjusted B+ voltage for activating said circuit means.

18. Apparatus according to claim 17 wherein said circuit means comprises means activatable for controlling the vertical size of the image produced by said CRT.

19. Apparatus according to claim 17 wherein said circuit means comprises means activatable for controlling the phase of said horizontal oscillator signal.

20. The method of operating a CRT video display in response to a variable frequency horizontal oscillator signal, comprising:
   generating a B+ voltage;
   developing a horizontal output drive signal for application to a horizontal deflection yoke, the amplitude of the horizontal drive signal being dependent upon both the B+ voltage and the frequency of the horizontal oscillator signal;
   peak detecting the amplitude of said horizontal output drive signal;
   maintaining the pulse amplitude of the horizontal output drive signal constant in response to variations in the frequency of the horizontal oscillator signal by adjusting the level of the B+ voltage in response to the peak detected amplitude of said horiziontal output drive signal; and
   applying the horizontal output drive signal to the horizontal deflection yoke for horizontally deflecting an electron beam of the CRT.

21. The method of claim 20 wherein said maintaining step comprises comparing the peak detected amplitude of the horizontal output drive signal with a reference signal and adjusting the level of the B+ voltage in response to the difference therebetween.

22. The method of claim 19 including the step of activating a selected circuit of the CRT display in response to the level of the adjusted B+ voltage achieving a predetermined threshold level.

* * * * *